(12) United States Patent
Bitene (10) Patent No.: US 11,833,910 B2
(45) Date of Patent: Dec. 5, 2023

(54) DYNAMIC ISOLATION MONITORING WITH LOW SENSITIVITY TO NOISE

(71) Applicant: Analog Devices International Unlimited Company, Limerick (IE)

(72) Inventor: Bostjan Bitene, Germering (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/653,585

(22) Filed: Mar. 4, 2022

(65) Prior Publication Data

US 2022/0289034 A1    Sep. 15, 2022

Related U.S. Application Data

(60) Provisional application No. 63/160,311, filed on Mar. 12, 2021.

(51) Int. Cl.
| | |
|---|---|
| *G01R 27/00* | (2006.01) |
| *B60L 3/00* | (2019.01) |
| *G01R 31/00* | (2006.01) |
| *G01R 27/02* | (2006.01) |
| *G01R 27/18* | (2006.01) |

(52) U.S. Cl.
CPC ........... *B60L 3/0069* (2013.01); *B60L 3/0046* (2013.01); *G01R 27/025* (2013.01); *G01R 27/18* (2013.01); *G01R 31/007* (2013.01)

(58) Field of Classification Search
USPC ........................................ 324/509, 551, 557
See application file for complete search history.

(56) References Cited

U.S. PATENT DOCUMENTS

| | | | |
|---|---|---|---|
| 9,046,559 B2 * | 6/2015 | Lindsay | .................... B60L 3/04 |
| 2019/0242932 A1 | 8/2019 | Clauvelin et al. | |
| 2021/0231742 A1 * | 7/2021 | Li | .......................... G01R 31/14 |

FOREIGN PATENT DOCUMENTS

EP    3675302 A1    7/2020

OTHER PUBLICATIONS

"Demo Manual DC2732A—LTC2949 Battery Stack Monitor", Analog Devices, Inc., (2020), 72 pgs.

* cited by examiner

*Primary Examiner* — Vincent Q Nguyen
(74) *Attorney, Agent, or Firm* — Schwegman Lundberg & Woessner, P.A.

(57) ABSTRACT

A method of monitoring a battery system includes connecting a voltage divider circuit to a battery of the battery system; measuring a first battery voltage; sampling a first chassis voltage for less than a settling time of the first chassis voltage and estimating a settled value of the first chassis voltage using sampled values of the first chassis voltage; changing a configuration of the voltage divider circuit; measuring a second battery voltage; sampling a second chassis voltage for less than a settling time of the second chassis voltage and estimating a settled value of the second chassis voltage using sampled values of the second chassis voltage; and determining isolation impedance of the battery to a chassis using the first and second battery voltages and the estimated settled values of the first and second chassis voltages.

22 Claims, 11 Drawing Sheets

DYNAMIC ISOLATION MONITORING WITH LOW SENSITIVITY TO NOISE

CLAIM OF PRIORITY

This application claims the benefit of priority to U.S. Provisional Application Ser. No. 63/160,311, filed Mar. 12, 2021, which is hereby incorporated by reference herein in its entirety.

BACKGROUND

Batteries for electric vehicles or electrical storage systems are isolated from chassis ground to protect users from electrical shocks. For example, in electric vehicles the high voltage battery and the electrical systems of the vehicle are isolated from the chassis ground, which can include the metal parts of the vehicle with which users come in contact. Isolation faults (e.g., current leakage from battery to chassis ground) can occur that can bring a battery system to a state where an electrical shock to the user is possible. Monitoring of the electrical isolation between the battery and the chassis can detect isolation faults and alert users of the possibility of electrical shocks. However, monitoring the electrical isolation can be complicated by noise, such as noise caused by operating an electrical vehicle for example.

OVERVIEW

This document relates generally to battery-powered systems and in particular to circuits that monitor electrical isolation of the battery systems. An example circuit includes a voltage divider circuit that is configurable, a voltage measurement circuit, a sampling circuit, and a microcontroller. The microcontroller is configured to connect the voltage divider circuit to a battery of the battery system, initiate a measurement of a first battery voltage by the voltage measurement circuit, calculate a settled value of the first chassis voltage using sampled values of the first chassis voltage sampled using the sampling circuit, change a configuration of the voltage divider circuit; initiate a measurement of a second battery voltage, calculate a settled value of the second chassis voltage using sampled values of the second chassis voltage, and calculate isolation impedance of the battery using the first battery voltage, the second battery voltage, and the calculated settled values of the first chassis voltage and the second chassis voltage.

A method example includes connecting a voltage divider circuit to a battery of the battery system; measuring a first battery voltage; sampling a first chassis voltage for less than a settling time of the first chassis voltage and estimating a settled value of the first chassis voltage using sampled values of the first chassis voltage; changing a configuration of the voltage divider circuit; measuring a second battery voltage; sampling a second chassis voltage for less than a settling time of the second chassis voltage and estimating a settled value of the second chassis voltage using sampled values of the second chassis voltage; and determining isolation impedance of the battery to a chassis using the first and second battery voltages and the estimated settled values of the first and second chassis voltages.

Another example circuit includes a voltage measurement circuit, a sampling circuit, a resistive divider circuit, and a microcontroller. The microcontroller is configured to initiate a measurement of a first battery voltage by the voltage measurement circuit; calculate a settled value of a first chassis voltage using sampled values of the first chassis voltage sampled using the sampling circuit; change a configuration of the resistive divider circuit; calculate a settled value of the second chassis voltage using sampled values of the second chassis voltage; and calculate isolation impedance of the battery using the battery voltage, the calculated settled value of the first chassis voltage, and the calculated settled value of the second chassis voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Battery systems for electric vehicles or electrical storage systems can include monitoring for isolation faults in which electrical isolation between the battery and chassis ground falls below some threshold impedance and the battery current leaks to the chassis ground.

Figure 1:
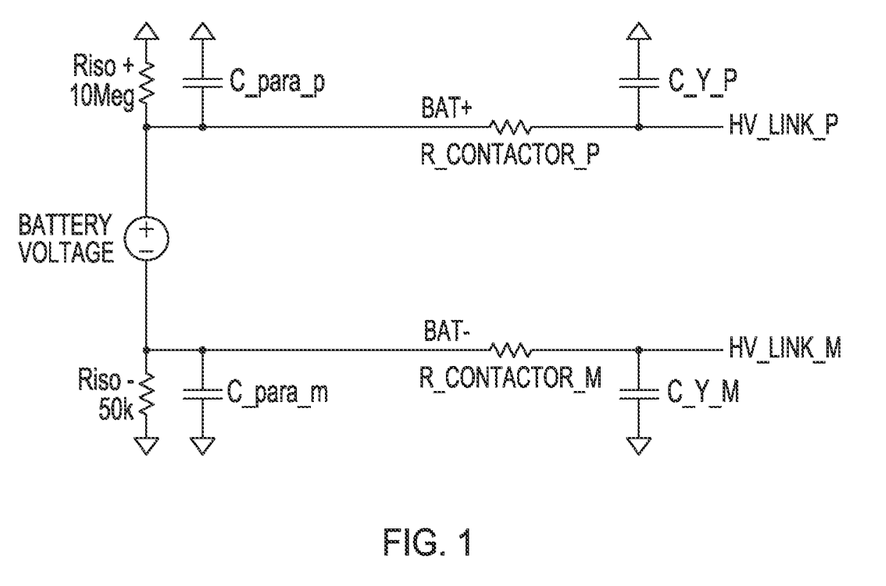
FIG. 1 is a circuit schematic of a circuit model for a battery system showing a battery and isolation impedance.

FIG. 1 is a circuit schematic of a circuit model for a battery system showing a battery and isolation impedance. The isolation impedance is modeled as resistances (RISO+ and RISO−) connected to terminals of the battery (BAT+, BAT−) and chassis ground. The circuit model shows parasitic capacitances ($C_{PARA\_P}$, $C_{PARA\_M}$) between the battery terminals and the chassis ground, and there are also Y-class capacitors (C_Y_P, C_Y_M) in the circuit model sometimes referred to as "Y-Caps". The Y-Caps filter electromagnetic interference (EMI) that occurs with operation of an electric vehicle. The circuit model shows an example of an isolation fault where the isolation resistance RISO− coupled to the negative terminal drops from 10 mega-ohms (10 MegΩ) to 50 kilo-ohms (50 kΩ). Isolation impedance monitoring should detect the drop in isolation impedance and generate an alert to the isolation fault.

One way to implement isolation monitoring is to connect and disconnect test resistors to the battery and measure the resulting shift of the battery terminal voltages with respect to chassis ground. The voltage measurements are made after the voltages settle out and become static after the change in the resistors. The isolation impedance between the battery and chassis ground can then be calculated using the measured static voltages and the known values of the test resistors.

Figure 2:
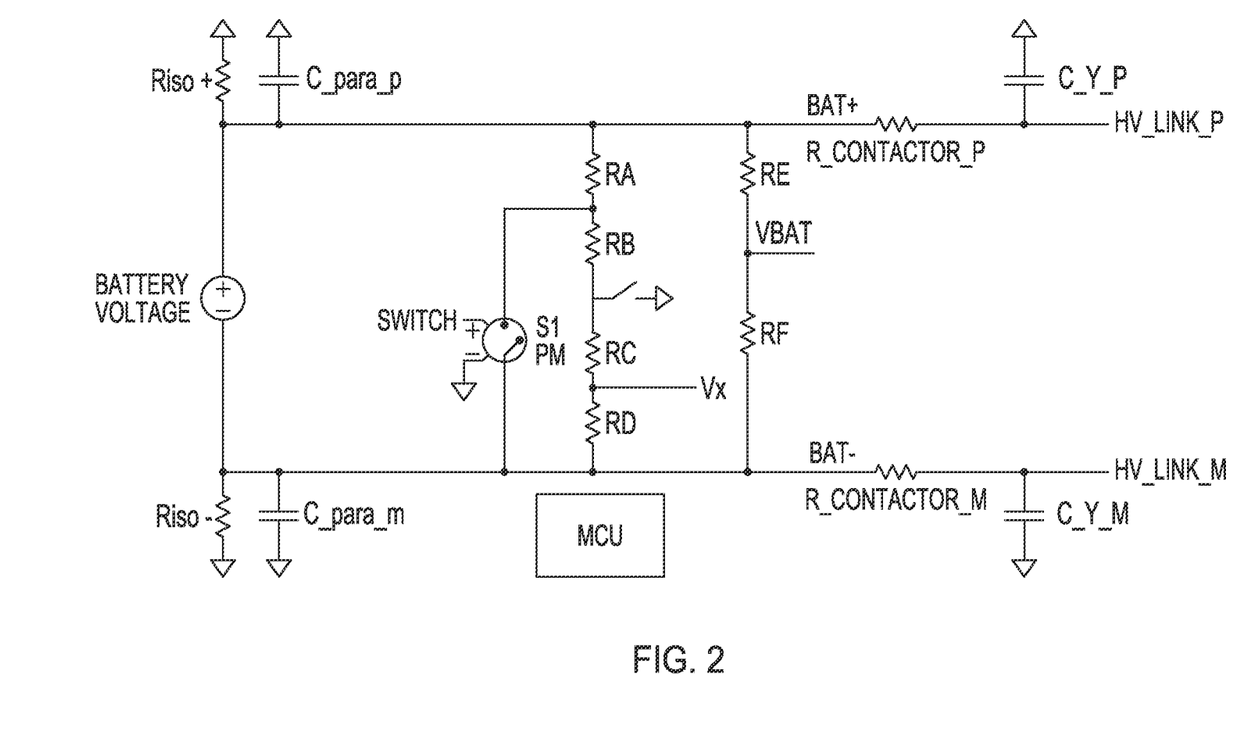
FIG. 2 is a circuit schematic of a circuit model for an example of a battery system and a voltage divider circuit.

FIG. 2 is a circuit schematic of a circuit model for an example of a battery system and a voltage divider circuit. The voltage divider circuit includes a resistive divider circuit with four resistors RA-RD and a switch circuit (switch S1). In normal operation, the voltage divider circuit may not be connected to the battery system. A microcontroller (MCU) connects the voltage divider circuit to the battery system using additional switch circuits (not shown) when it is time for isolation monitoring. Some examples of the microcontroller include a processor, a microprocessor, an application specific integrated circuit (ASIC), a field programmable gate array (FPGA), or the like.

To monitor the isolation impedance, the battery voltage VBAT and a chassis-to-ground voltage, or chassis voltage Vx, are measured with the resistors connected to the battery system and with the switch S1 open or inactive. The microcontroller then activates or closes the switch S1 to reconfigure the resistive network, and the battery voltage VBAT and chassis voltage Vx are measured again. The changes in VBAT and Vx are used to determine the isolation impedance between the battery and the chassis.

Figure 3A:
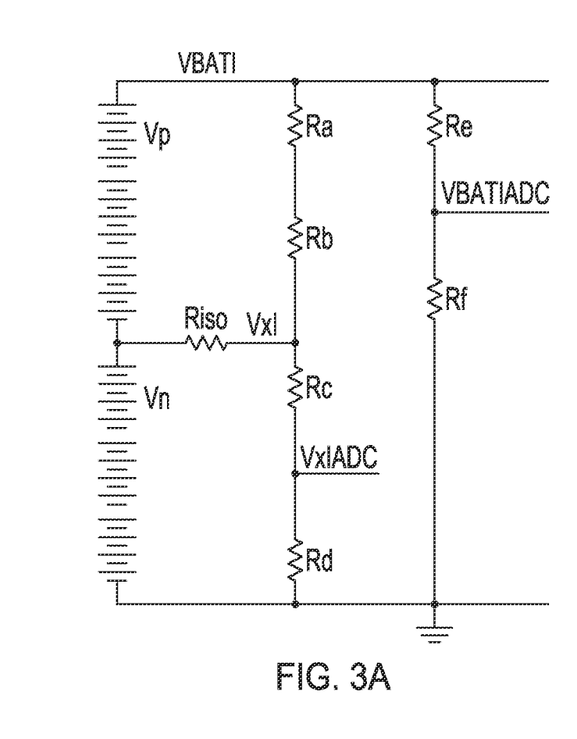
FIGS. 3A and 3B are circuit schematics of a battery and a voltage divider circuit.
Figure 3B:
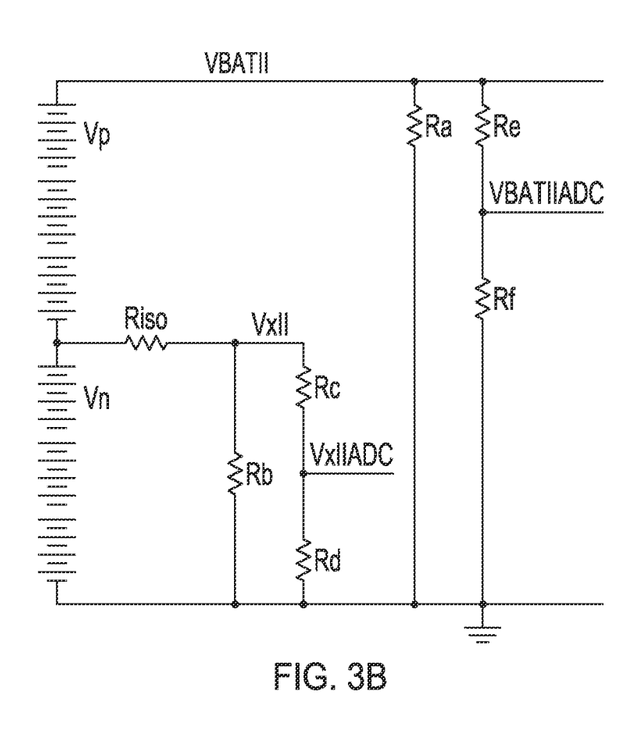

FIGS. 3A and 3B are circuit schematics of the battery and the resistive divider circuit. FIG. 3A shows the resistive divider and battery in FIG. 2 when the switch S1 is open, and FIG. 3B shows the resistive divider and battery when the switch S1 is closed. The isolation impedance to be monitored is shown as resistor RISO in the Figures. A second resistive divider that includes resistors RE and RF is used to divide the battery voltage. Voltage Vx is a chassis to ground voltage. The voltages VBAT and Vx are measured at the resistors shown using a measurement circuit that includes an analog-to-digital converter (ADC) circuit.

In FIG. 3A, voltages VBATI and VxI are the battery voltage and chassis voltage when the switch S1 is open. VBATIADC is the divided battery voltage measured using an ADC circuit and VxIADC is the divided chassis voltage measured using an ADC circuit when the switch S1 is open. In FIG. 3B, VBATII and VxII are the battery voltage and chassis voltage when the switch S1 is closed, and VBATIADC and VxIIADC are the battery and chassis voltages measured using an ADC circuit. The isolation impedance can be calculated as follows, where conductance is denoted as Y, or Yx=1/Rx.

$$RP = RA + RB, RN = RC + RD,$$

$$Vx = VxADC * (YC + YD)/YC,$$

$$VBAT = VBATADC * (YE - YF)/YE,$$

$$YISO = \frac{YB - YP + \frac{VBATI}{VxI} * YP}{1 - \frac{VBATI}{VBATII} * \frac{VxII}{VxI}} - YN - YB,$$

$$YISO += \frac{YB + YP * \left(\frac{VBATI}{VxI} - 1\right)}{\frac{VBATII}{VxII} - \frac{VBATI}{VxI}},$$

$$YISO -= YISO - YISO+.$$

There is a time constraint on the amount of time to test for an isolation fault. If the capacitance due to filtering and circuit parasitics is large, it can take too long for the voltages to settle asymptotically to their static values to make a straightforward calculation of the isolation impedance. In this case, an estimation of the static or settled voltage values is needed.

Figure 4:
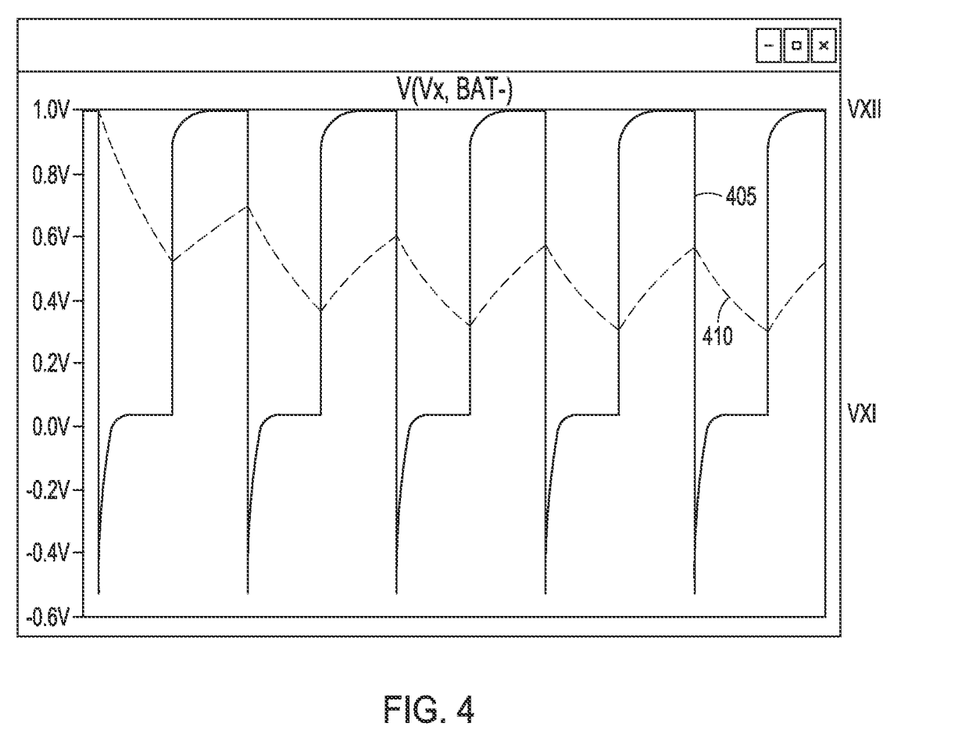
FIG. 4 is a graph showing waveforms of a chassis-to-ground voltage.

FIG. 4 is a graph showing waveforms of the chassis voltage Vx. The graph shows a waveform 405 for VxI and VxII for smaller capacitance and a waveform 410 for larger capacitance. Waveform 405 reaches the static values for VxI and VxII following the opening and closing of switch S1 to change the resistive divider network. For waveform 410, the RC time constant is too long for the waveforms to reach the static value. To estimate the settled value of VxI and VxII, the decay value of the voltage is calculated and used to calculate the final settled values of the voltages VxI and VxII.

Figure 5:
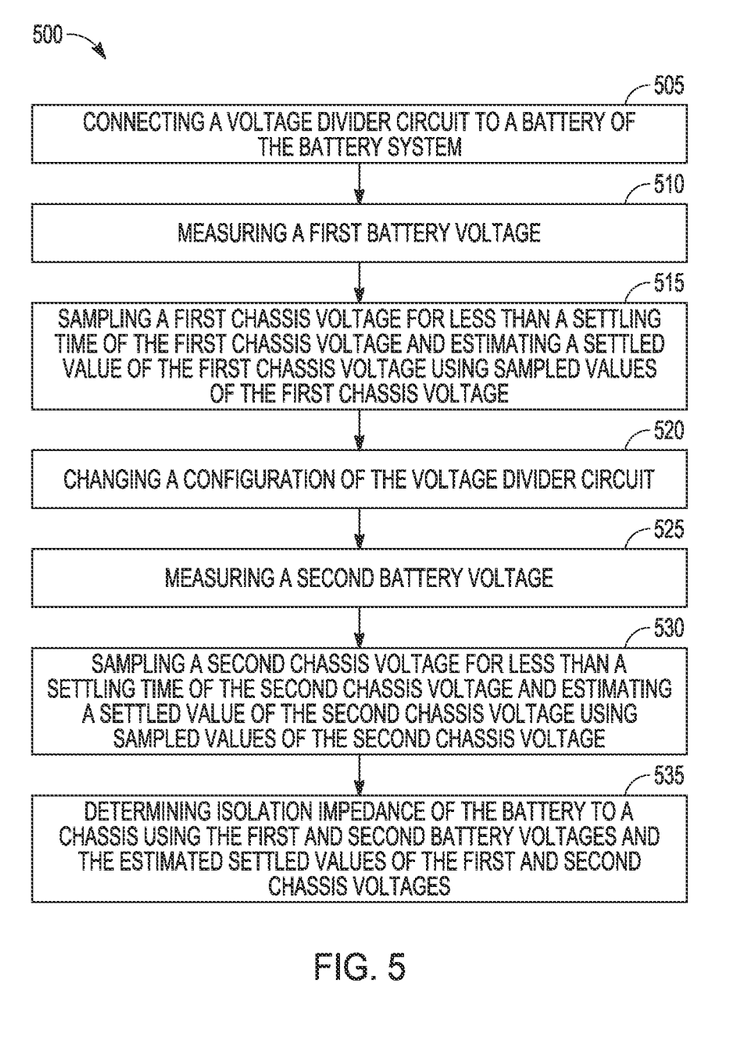
FIG. 5 is a flow diagram of a method of monitoring a battery system for an isolation fault.

FIG. 5 is a flow diagram outlining a method 500 of monitoring a battery system for an isolation fault. The method may be performed using the circuit and microcontroller of FIG. 2. At block 505, a voltage divider circuit is connected to a battery of the battery system. The voltage divider circuit may be unconnected in a normal operating mode and connected in a test or monitoring mode. In certain examples, the voltage divider circuit is always connected to the battery system. At block 510, a battery voltage (e.g., VBATI in the previous equations) is measured.

The battery voltage may be measured using an ADC circuit. The measurement may be initiated by the microcontroller. At block 515, a chassis voltage (e.g., VxI) is sampled (e.g., using a sample and hold circuit) for less than a settling time of the chassis voltage after the voltage divider circuit is connected or reconfigured. The settled value of the first chassis voltage is estimated using the sampled values of the chassis voltage.

Figure 6A:
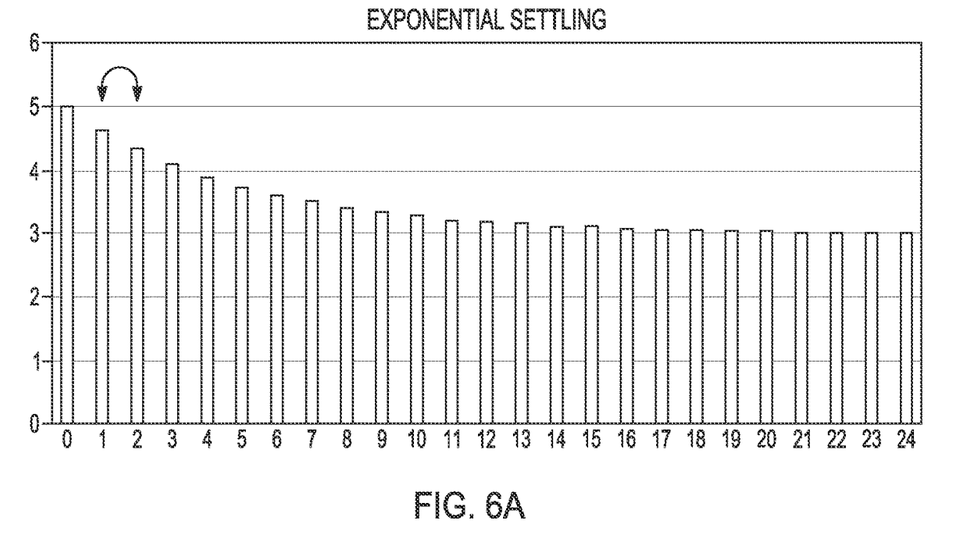
FIGS. 6A-6D an approach to determining the settled value of an asymptotically decreasing chassis-to-ground voltage.

FIGS. 6A-6D illustrate an approach to determining the settled value of an asymptotically decreasing chassis voltage Vx without waiting for the voltage to settle to its final static value. In FIG. 6A, the decaying voltage is sampled, such as by using a sample and hold circuit. The sampled voltage can be measured by being quantified by an ADC circuit. The chassis voltage is sampled using a sufficiently small sampling time (e.g., sampling every half second (0.5 sec) over 5 seconds). In some examples, the sampling time can be determined according to underlying oversampling and filtering techniques described elsewhere herein.

Figure 6B:
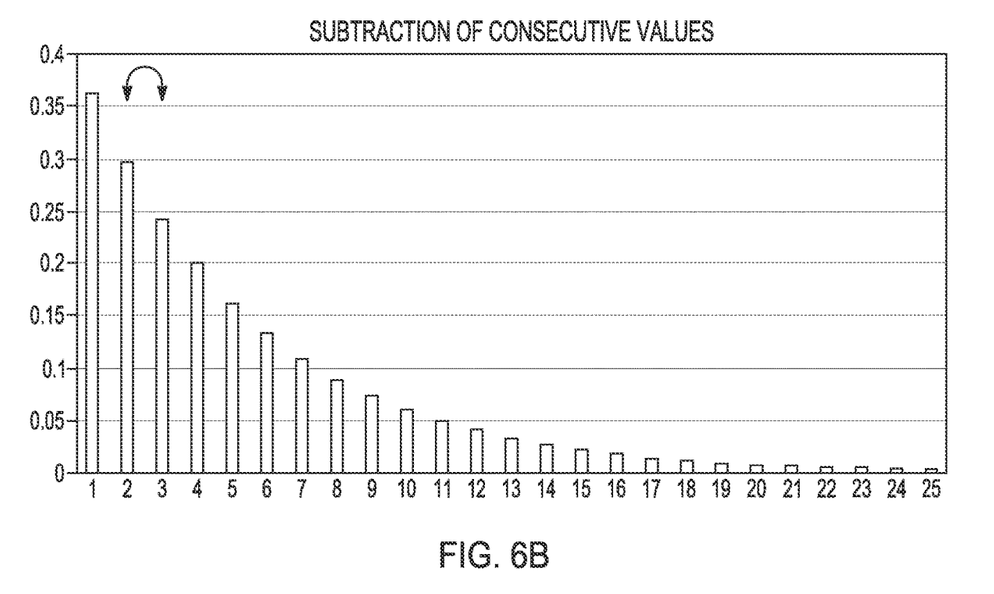

In FIG. 6B, the derivative of the samples of the voltage is determined. The derivative of an exponential function is the same exponential function multiplied by a factor. The derivative of the sampled voltage values is approximated by subtracting consecutive values of the samples. The decay from the initial value of the chassis voltage continues until the chassis voltage reaches its settled value.

Figure 6C:
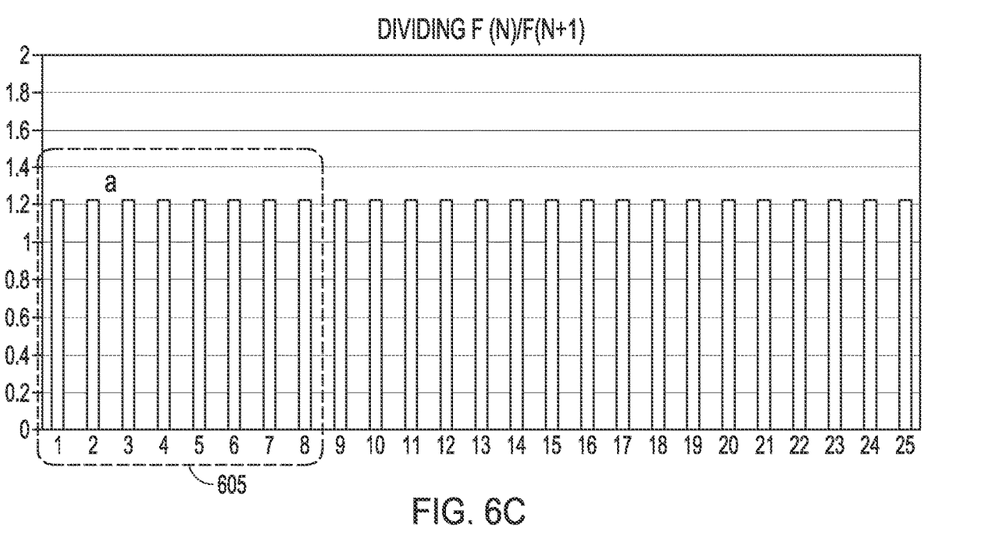
Figure 6D:
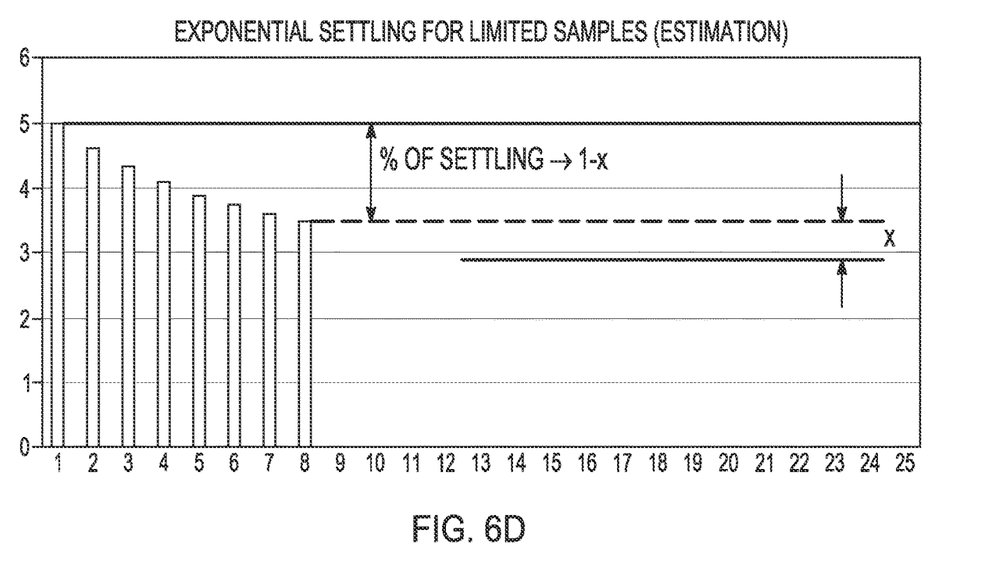

In FIG. 6C, consecutive subtracted values (F(1), F(2), (F(3), . . . ) are divided. In FIG. 6C, the first eight values in box 605 are used. The ratio of consecutive values (F(N)/F (N+1) is the decay per time step which is a constant value that is decay value "a." In FIG. 6D, the asymptotic value of the voltage is calculated. The decay per time step ("a") raised by the number of time steps in an interval (e.g., $a^{-8}$ if 8 time steps) is the percentage of the decay that has not yet happened at the end of the sampled intervals (e.g., the percent of the decay that happens after the 5 second interval). If $x=a^4$, then $1-x$ is the percentage decay that has already happened, and x is the remaining percentage of the decay. Multiplying the difference of the first and last sampled values by x, dividing by $(1-x)$, and subtracting the result from the last sampled value results in the static value of Vx.

Returning to FIG. 5 at block 520, a configuration of the voltage divider circuit is changed, such as by activating switch S1 in the circuit example of FIG. 2 for example. At block 525, the battery voltage is measured after the change (e.g., VBATII in the previous equations). At block 530, a second chassis voltage (e.g., VxII in the previous equations) is sampled for less than a settling time of the second chassis voltage and estimating a settled value of the second chassis voltage is estimated using sampled values of the second chassis voltage. At block 535, the isolation impedance of the battery to the chassis is determined using the measured battery voltages and the static values of the chassis voltages (e.g., VBATI, VBATII, VxI, VxII). The isolation impedance can be calculated by the microcontroller using the previous equations, which are fairly straightforward and do not involve complex operations.

The calculation of the static or settled voltages is challenging in the presence of large noise disturbances (e.g., operating noise of an electric vehicle). To minimize the effect of the noise on the calculations, filtering and optionally simultaneous sampling should be applied along the signal chain. Measured voltages can be pre-filtered by analog filter circuits or by digital filtering using the microcontroller (e.g., moving average, infinite impulse response (IIR) filtering, or finite impulse response (FIR) filtering).

Figure 7A:
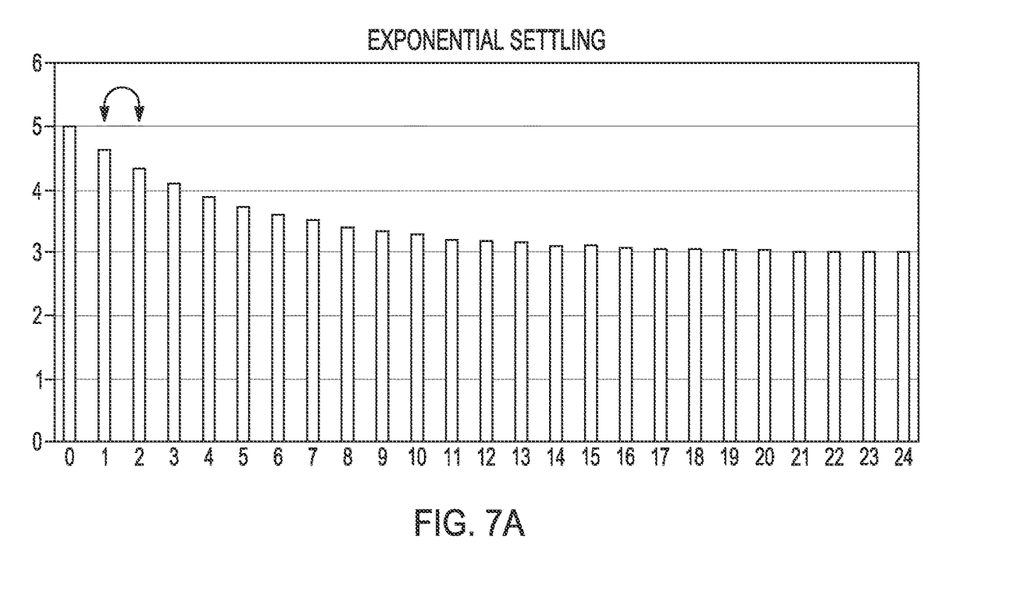
FIGS. 7A-7D illustrate an approach to determining the settled value of an asymptotically decreasing chassis-to-ground voltage in the presence of noise.
Figure 7B:
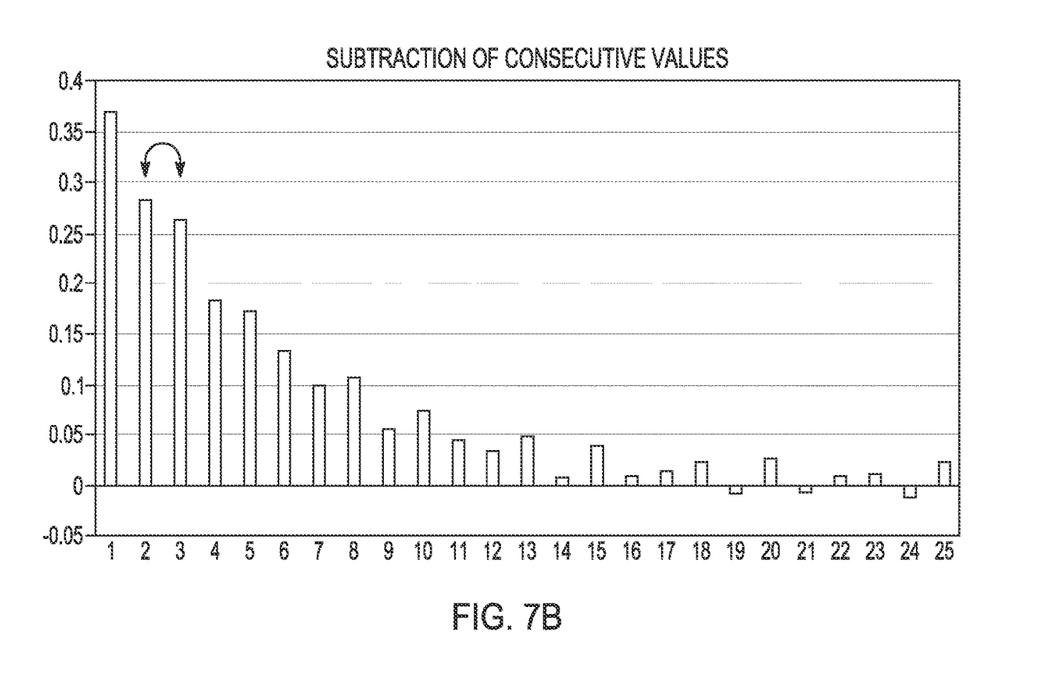
Figure 7C:
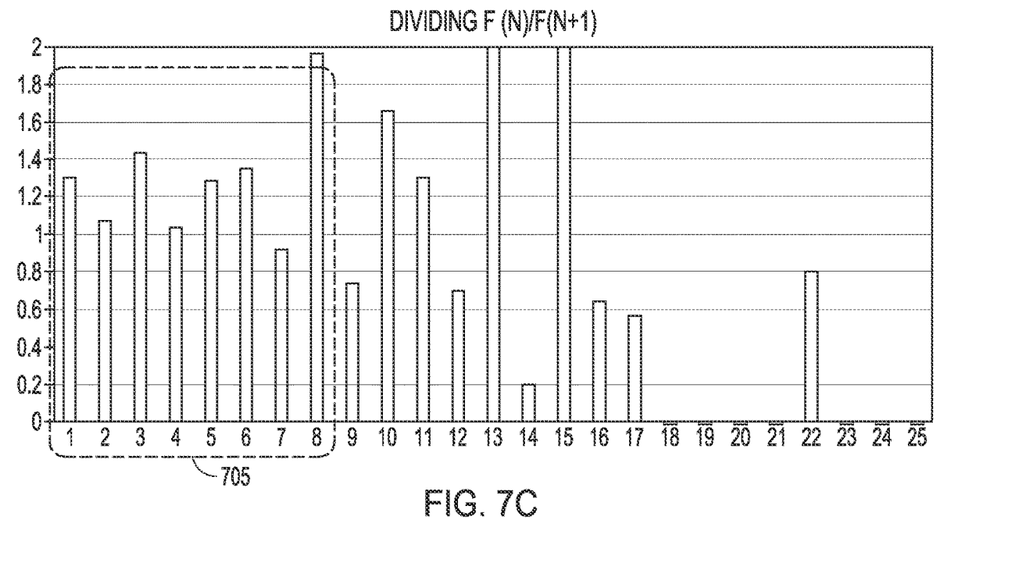
Figure 7D:
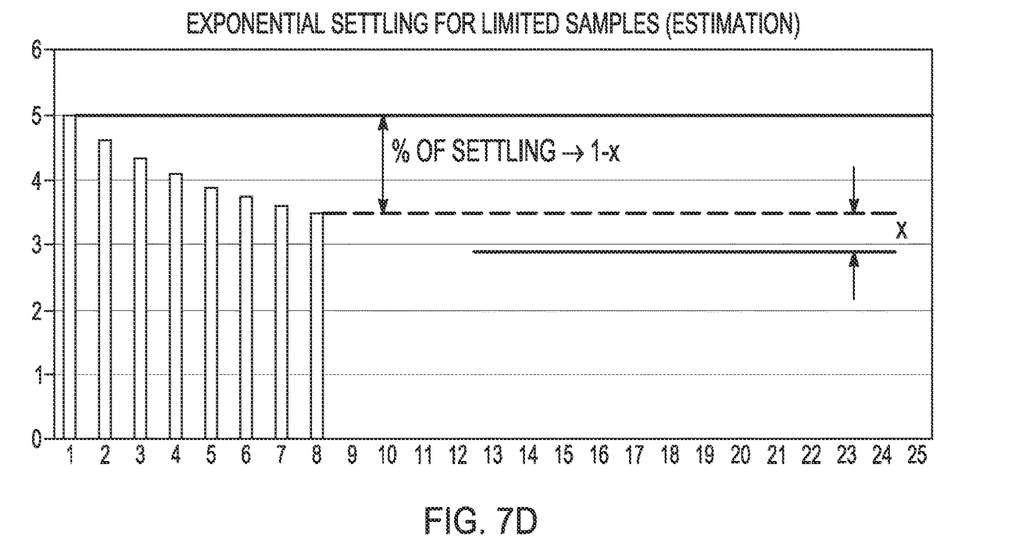

FIGS. 7A-7D illustrate an approach to determining the settled value of a falling value of chassis voltage Vx in the presence of noise. In FIG. 7A, the decaying voltage is sampled as in FIG. 6A. FIG. 7B shows an example of the differences in consecutive values of the samples in the presence of operating noise. Filtering can be applied to one or both of the samples and the differences in the consecutive samples to reduce noise. For example, the differences in FIG. 7B can be averaged to produce a filtered derivative. FIG. 7C shows the decay value in the presence of noise. The decay value is calculated using ratios of the difference values. The ratios can be filtered and used to determine the decay value. In FIG. 7C, the eight sampled values within box 705 are filtered by averaging the values. The corner frequencies of the filtering should be at least an order of magnitude higher than the RC settling that needs to be measured, otherwise the settling is no more a single RC decay and the method may not be applicable to the filtered measurements.

Figure 8:
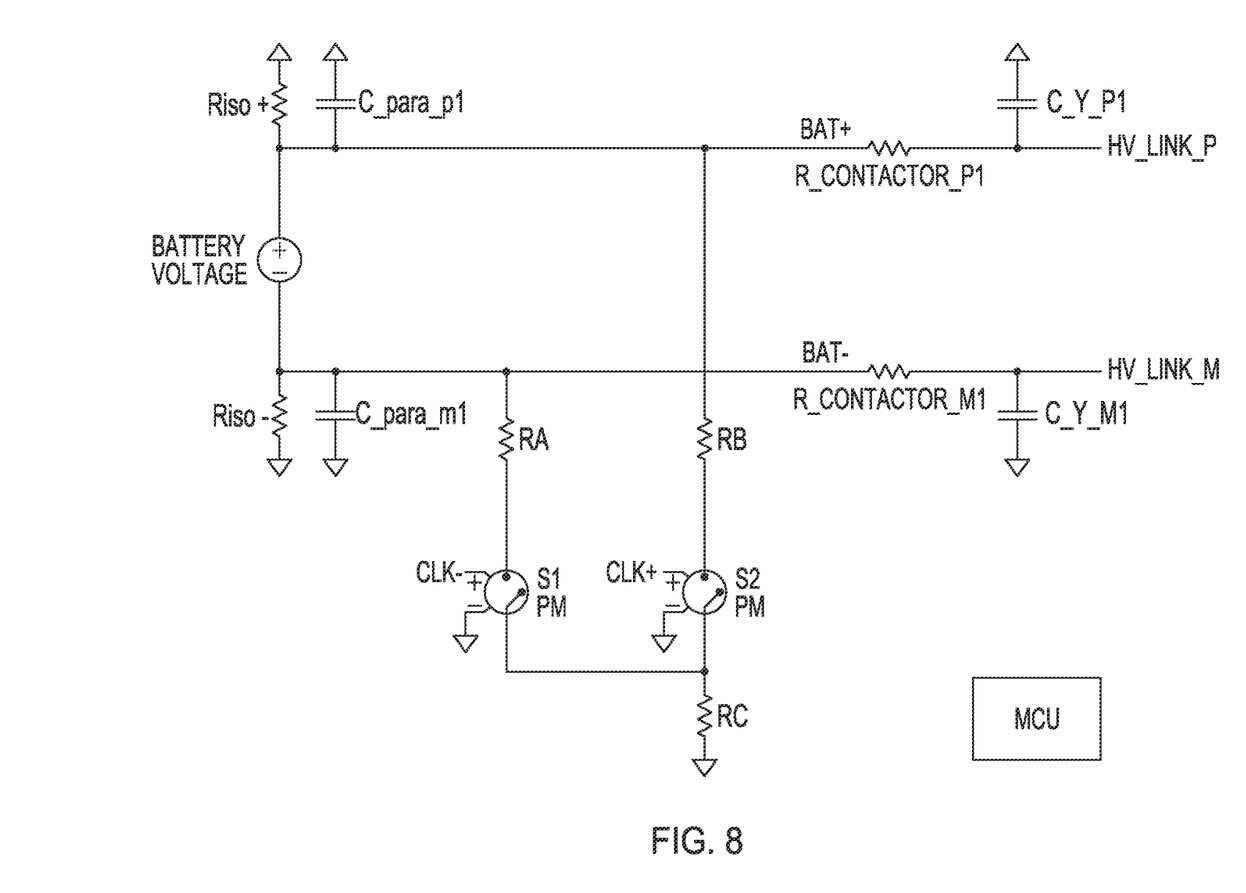
FIG. 8 is a circuit schematic of a circuit model for another example of a battery system and a voltage divider circuit.

FIG. 8 is a circuit schematic of a circuit model for another example of a battery system and a voltage divider circuit. The voltage divider circuit includes resistors RA, RB, and RC and two switch circuits (switch S1 and switch S2). To change the configuration of the voltage divider circuit, the microcontroller activates switches S1 and S2 in a push-pull fashion so that either RA or RB is in series with RC. The voltages at the battery terminals with respect to chassis ground (VBAT+, VBAT−) can be calculated by measuring the voltage across RC for both switch positions and then subtracting the measured voltages. The voltages at the battery terminals could also be determined with a separate voltage divider circuit monitoring VBAT+ to chassis ground or VBAT− to chassis ground.

The isolation impedance can be calculated using the following equations.

$$K1 = \frac{VxI}{VBATI - VxI},$$

$$K2 = \frac{VBATII - VxII}{VxII},$$

$$RISO+= \frac{K1 \cdot K2 - 1}{K2 + 1} \cdot (RB + RC),$$

$$RISO-= \frac{K1 \cdot K2 - 1}{K1 + 1} \cdot (RA + RC),$$

where RISO+ and RISO− are the resistances from the positive and negative battery terminals to chassis ground to be monitored, RA and RB are the test resistances coupled from the positive and negative battery terminals to resistor RC. To determine the isolation impedance, only one of the battery terminal voltages (either VBAT+ to chassis ground or VBAT− to chassis ground) needs to be monitored. If VBAT+ is used, VxI is the upper settled asymptotic value of VBAT+ and VxII is the lower settled asymptotic value of VBAT+.

Figure 9:
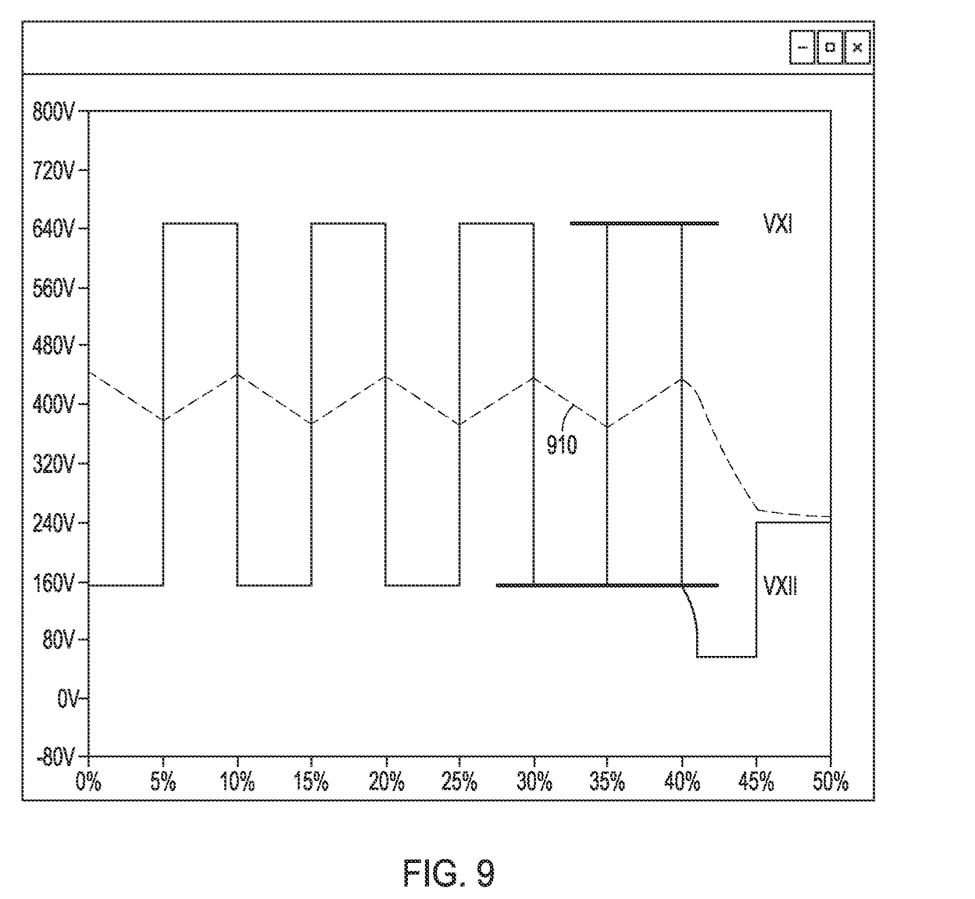
FIG. 9 is a graph showing a waveform that is sampled to the determine the settled asymptotic values of chassis voltages.

FIG. 9 is a graph showing a waveform 910 that is sampled to the determine the settled asymptotic values of chassis voltages VxI and VxII. If RA is different from RB in FIG. 1, both settled values of VxI and VxII need to be calculated. But if RA is equal to RB, only one settled value needs to be calculated and can be used for both VxI and VxII. As in the example circuit of FIG. 2, filtering can be applied along the signal chain and the measured voltages can be pre-filtered using analog filter circuits or by digital filtering using the microcontroller.

The devices, methods, and systems described herein provide periodic isolation monitoring for faults in high voltage battery systems such as electric vehicles. The monitoring has a quick response due to early estimation of asymptotically settled voltages values. The estimations don't require complex calculations and the implementation is straightforward and can be made robust to large superimposed noise signals.

ADDITIONAL DESCRIPTION AND ASPECTS

A first Aspect (Aspect 1) includes subject matter (such as a monitoring circuit for a battery system) comprising a voltage divider circuit that is configurable, a voltage measurement circuit, a sampling circuit, and a microcontroller. The microcontroller is configured to connect the voltage divider circuit to a battery of the battery system, initiate a measurement of a first battery voltage by the voltage measurement circuit, calculate a settled value of the first chassis voltage using sampled values of the first chassis voltage sampled using the sampling circuit, change a configuration of the voltage divider circuit, initiate a measurement of a second battery voltage, calculate a settled value of the second chassis voltage using sampled values of the second chassis voltage, and calculate isolation impedance of the battery using the first battery voltage, the second battery voltage, and the calculated settled values of the first chassis voltage and the second chassis voltage.

In Aspect 2, the subject matter of Aspect 1 optionally includes a microcontroller configured to calculate a derivative of the sampled values of the first chassis voltage and calculate a derivative of the sampled values of the second chassis voltage, determine a first ratio of consecutive derivatives for the first chassis voltage and determine a second ratio of consecutive derivatives for the second chassis voltage, determine a first decay value using the first ratio and determine a second decay value using the second ratio, and calculate the first chassis voltage using.

In Aspect 3, the subject matter of Aspect 1 optionally includes a microcontroller configured to calculate a first difference of the sampled values of the first chassis voltage and calculate a second difference of the second chassis voltage, determine a first ratio of consecutive first differences and determine a second ratio of consecutive second differences, determine a first decay value using the first ratio and determine a second decay value using the second ratio, and calculate the first chassis voltage using the first decay value and calculate the second chassis voltage using the second decay value.

In Aspect 4, the subject matter of Aspect 3 optionally includes the microcontroller further configured to calculate a first filtered ratio of the consecutive first differences, calculate a second filtered ratio of the consecutive second differences, and determine the decay value using the filtered ratio.

In Aspect 5, the subject matter of one or any combination of Aspects 1-4 optionally includes a microcontroller configured to filter the sampled values of the first chassis voltage, filter the sampled values of the second chassis voltage, and calculate the settled values of the first chassis voltage and the second chassis voltage using filtered sampled values of the first chassis voltage and the second chassis voltage.

In Aspect 6, the subject matter of one or any combination of Aspects 1-5 optionally includes a microcontroller configured to compare the calculated isolation impedance to a threshold and generate an alert when the determined isolation impedance is less than the threshold.

In Aspect 7, the subject matter of one or any combination of Aspects 1-6 optionally includes a monitoring circuit for a electric vehicle and a resistive divider circuit configured to electrically connect the battery of the battery system to a chassis of the electric vehicle through the voltage divider circuit.

In Aspect 8, the subject matter of one or any combination of Aspects 1-7 optionally includes a sampling circuit that includes a sample and hold circuit and an analog-to-digital converter circuit.

In Aspect 9, the subject matter of one or any combination of Aspects 1-8 optionally includes a voltage divider circuit that includes multiple series connected resistors including a first resistor and a second resistor connected by a circuit node, the multiple series connected resistors are connected in parallel to the battery, and a switching circuit coupled to the circuit node. The subject matter further optionally includes a microcontroller configured to change the configuration of the resistive divider circuit by activating the switching circuit to connect the circuit node to circuit ground.

In Aspect 10, the subject matter of one or any combination of Aspects 1-9 optionally includes a voltage divider circuit that includes a first resistor and a first switch coupled in series to a first battery terminal of the battery, a second resistor and a second switch coupled in series to a second battery terminal of the battery, a third resistor coupled to the first and second switch circuits and to circuit ground. The subject matter further optionally includes a microcontroller configured to change the configuration of the resistive divider circuit by changing from activating the first switch and deactivating the second switch to deactivating the first switch and activating the second switch.

Aspect 11 includes subject matter (such as a method of monitoring a battery system) or can optionally be combined with one or any combination of Aspects 1-10 to include such subject matter, comprising connecting a voltage divider circuit to a battery of the battery system, measuring a first battery voltage, sampling a first chassis voltage for less than a settling time of the first chassis voltage and estimating a settled value of the first chassis voltage using sampled values of the first chassis voltage, changing a configuration of the voltage divider circuit, measuring a second battery voltage, sampling a second chassis voltage for less than a settling time of the second chassis voltage and estimating a settled value of the second chassis voltage using sampled values of the second chassis voltage, and determining isolation impedance of the battery to a chassis using the first and second battery voltages and the estimated settled values of the first and second chassis voltages.

In Aspect 12, the subject matter of Aspect 11 optionally includes calculating a derivative of the sampled values of the chassis voltage, determining a ratio of consecutive derivatives of the sampled values, and determining a decay value using the ratio and calculating the settled value of the chassis voltage using the determined decay value.

In Aspect 13, the subject matter of Aspect 11 optionally includes calculating a difference of sampled values of the chassis voltage and determining a ratio of consecutive differences of the sampled values, and determining a decay value using the ratio and calculating the settled value of the chassis voltage using the determined decay value.

In Aspect 14, the subject matter of Aspect 13 optionally includes filtering the ratio of the consecutive differences of the sampled values and determining the decay value using the filtered ratio.

In Aspect 15, the subject matter of one or any combination of Aspects 11-14 optionally includes filtering the sampled values of the first chassis voltage and the sampled values of the second chassis voltage, and estimating the settled values of the first chassis voltage and the second chassis voltage using filtered sampled values of the first chassis voltage and the second chassis voltage.

In Aspect 16, the subject matter of one or any combination of Aspects 11-15 optionally includes comparing the determined isolation impedance to a threshold and generating an alert when the determined isolation impedance is less than the threshold.

In Aspect 17, the subject matter of one or any combination of Aspects 11-16 optionally includes a method of monitoring a battery system of an electric vehicle, and electrically isolating the battery from the chassis in an operating mode and electrically connecting the battery to the chassis through the voltage divider circuit in a test mode.

Aspect 18 includes subject matter (such as a monitoring circuit for a battery system) or can optionally be combined with one or any combination of Aspects 1-17 to include such subject matter, comprising a voltage measurement circuit, a sampling circuit, a resistive divider circuit, and a microcontroller. The microcontroller is configured to initiate a measurement of a first battery voltage by the voltage measurement circuit, calculate a settled value of a first chassis voltage using sampled values of the first chassis voltage sampled using the sampling circuit, change a configuration of the resistive divider circuit, calculate a settled value of the second chassis voltage using sampled values of the second chassis voltage, and calculate isolation impedance of the battery using the battery voltage, the calculated settled value of the first chassis voltage, and the calculated settled value of the second chassis voltage.

In Aspect 19, the subject matter of Aspect 18 optionally includes a first resistor and a first switching circuit coupled in series to a first battery terminal of the battery, a second resistor and a second switching circuit coupled in series to a second battery terminal of the battery, and a third resistor coupled to the first and second switching circuits and to circuit ground. The subject matter optionally further includes a microcontroller configured to change the configuration of the resistive divider circuit by changing from activating the first switching circuit and deactivating the second switching circuit to deactivating the first switching circuit and activating the second switching circuit.

In Aspect 20, the subject matter of one or both of Aspects 18 and 19 optionally includes a microcontroller configured to initiate a measurement of a second battery voltage after the change in configuration of the resistive divider circuit, and calculate isolation impedance of the battery using the first battery voltage, the calculated settled value of the first chassis voltage, the calculated settled value of the second chassis voltage, and the second battery voltage.

In Aspect 21, the subject matter of one or any combination of Aspects 18-20 optionally includes a resistive divider that includes multiple series connected resistors including a first resistor and a second resistor connected by a circuit node, the multiple series connected resistors connected in parallel to the battery, and a switching circuit coupled to the circuit node. The subject matter optionally further includes a microcontroller configured to change the configuration of the resistive divider circuit by activating the switching circuit to connect the circuit node to circuit ground.

In Aspect 22, the subject matter of one or any combination of Aspects 18-21 optionally includes a microcontroller configured to calculate a difference of sampled values of at least one of the first or second chassis voltages and determine a ratio of consecutive differences of the sampled values of the at least one of the first or second chassis voltages, and determine a decay value using the determined ratio and calculate the settled value of the at least one of the first or second chassis voltages using the determined decay value.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A monitoring circuit for a battery system, the circuit comprising:
    a voltage divider circuit that is configurable;
    a voltage measurement circuit;
    a sampling circuit; and
    a microcontroller, wherein the microcontroller is configured to:
        connect the voltage divider circuit to a battery of the battery system;
        initiate a measurement of a first battery voltage by the voltage measurement circuit;
        calculate a settled value of a first chassis voltage using sampled values of the first chassis voltage sampled using the sampling circuit;
        change a configuration of the voltage divider circuit;
        initiate a measurement of a second battery voltage;
        calculate a settled value of a second chassis voltage using sampled values of the second chassis voltage; and
        calculate isolation impedance of the battery using the first battery voltage, the second battery voltage, and the calculated settled values of the first chassis voltage and the second chassis voltage.

2. The circuit of claim 1, wherein the microcontroller is further configured to:
    calculate a derivative of the sampled values of the first chassis voltage and calculate a derivative of the sampled values of the second chassis voltage;
    determine a first ratio of consecutive derivatives for the first chassis voltage and determine a second ratio of consecutive derivatives for the second chassis voltage;
    determine a first decay value using the first ratio and determine a second decay value using the second ratio; and
    calculate the first chassis voltage using the first decay value and calculate the second chassis voltage using the second decay value.

3. The circuit of claim 1, wherein the microcontroller is further configured to:
    calculate a first difference of the sampled values of the first chassis voltage and calculate a second difference of the second chassis voltage;

determine a first ratio of consecutive first differences and determine a second ratio of consecutive second differences;

determine a first decay value using the first ratio and determine a second decay value using the second ratio; and calculate the first chassis voltage using the first decay value and calculate the second chassis voltage using the second decay value.

4. The circuit of claim 3, wherein the microcontroller is further configured to:

calculate a first filtered ratio of the consecutive first differences;

calculate a second filtered ratio of the consecutive second differences; and determine the decay value using the filtered ratio.

5. The circuit of claim 1, wherein the microcontroller is further configured to:

filter the sampled values of the first chassis voltage;

filter the sampled values of the second chassis voltage; and calculate the settled values of the first chassis voltage and the second chassis voltage using filtered sampled values of the first chassis voltage and the second chassis voltage.

6. The circuit of claim 1, wherein the microcontroller is further configured to:

compare the calculated isolation impedance to a threshold; and generate an alert when the determined isolation impedance is less than the threshold.

7. The circuit of claim 1, wherein the battery system is a battery system for an electric vehicle, and the resistive divider circuit is configured to electrically connect the battery of the battery system to a chassis of the electric vehicle through the voltage divider circuit.

8. The circuit of claim 1, wherein the sampling circuit includes a sample and hold circuit and an analog-to-digital converter circuit.

9. The circuit of claim 1, wherein the voltage divider circuit includes:

multiple series connected resistors including a first resistor and a second resistor connected by a circuit node, and the multiple series connected resistors are connected in parallel to the battery; and a switching circuit coupled to the circuit node;

wherein the microcontroller is configured to change the configuration of the resistive divider circuit by activating the switching circuit to connect the circuit node to circuit ground.

10. The circuit of claim 1, wherein the voltage divider circuit includes:

a first resistor and a first switch coupled in series to a first battery terminal of the battery;

a second resistor and a second switch coupled in series to a second battery terminal of the battery;

a third resistor coupled to the first and second switch circuits and to circuit ground; and wherein the microcontroller is configured to change the configuration of the resistive divider circuit by changing from activating the first switch and deactivating the second switch to deactivating the first switch and activating the second switch.

11. A method of monitoring a battery system, the method comprising:

connecting a voltage divider circuit to a battery of the battery system;

measuring a first battery voltage;

sampling a first chassis voltage for less than a settling time of the first chassis voltage and estimating a settled value of the first chassis voltage using sampled values of the first chassis voltage;

changing a configuration of the voltage divider circuit;

measuring a second battery voltage;

sampling a second chassis voltage for less than a settling time of the second chassis voltage and estimating a settled value of the second chassis voltage using sampled values of the second chassis voltage; and determining isolation impedance of the battery to a chassis using the first and second battery voltages and the estimated settled values of the first and second chassis voltages.

12. The method of claim 11, wherein estimating the settled value of either the first chassis voltage or the second chassis voltage includes:

calculating a derivative of the sampled values of the chassis voltage;

determining a ratio of consecutive derivatives of the sampled values; and determining a decay value using the ratio and calculating the settled value of the chassis voltage using the determined decay value.

13. The method of claim 11, wherein estimating the settled value of either the first chassis voltage or the second chassis voltage includes:

calculating a difference of sampled values of the chassis voltage and determining a ratio of consecutive differences of the sampled values; and determining a decay value using the ratio and calculating the settled value of the chassis voltage using the determined decay value.

14. The method of claim 13, including filtering the ratio of the consecutive differences of the sampled values, and determining the decay value using the filtered ratio.

15. The method of claim 11, including:

filtering the sampled values of the first chassis voltage and the sampled values of the second chassis voltage; and estimating the settled values of the first chassis voltage and the second chassis voltage using filtered sampled values of the first chassis voltage and the second chassis voltage.

16. The method of claim 11, including:

comparing the determined isolation impedance to a threshold; and generating an alert when the determined isolation impedance is less than the threshold.

17. The method of claim 11, wherein the battery system is a battery system for an electric vehicle, and wherein the method further includes electrically isolating the battery from the chassis in an operating mode and electrically connecting the battery to the chassis through the voltage divider circuit in a test mode.

18. A monitoring circuit for a battery system, the circuit comprising:

a voltage measurement circuit;

a sampling circuit;

a resistive divider circuit;

a microcontroller circuit, wherein the microcontroller is configured to:

initiate a measurement of a first battery voltage by the voltage measurement circuit;

calculate a settled value of a first chassis voltage using sampled values of the first chassis voltage sampled using the sampling circuit;

change a configuration of the resistive divider circuit;

calculate a settled value of a second chassis voltage using sampled values of the second chassis voltage; and calculate isolation impedance of the battery using the battery voltage, the calculated settled value of the first chassis voltage, and the calculated settled value of the second chassis voltage.

19. The circuit of claim 18, wherein the voltage divider circuit includes:

a first resistor and a first switching circuit coupled in series to a first battery terminal of the battery;

a second resistor and a second switching circuit coupled in series to a second battery terminal of the battery;

a third resistor coupled to the first and second switching circuits and to circuit ground; and wherein the microcontroller is configured to change the configuration of the resistive divider circuit by changing from activating the first switching circuit and deactivating the second switching circuit to deactivating the first switching circuit and activating the second switching circuit.

20. The circuit of claim 18, wherein the microcontroller circuit is further configured to:

initiate a measurement of a second battery voltage after the change in configuration of the resistive divider circuit; and calculate isolation impedance of the battery using the first battery voltage, the calculated settled value of the first chassis voltage, the calculated settled value of the second chassis voltage, and the second battery voltage.

21. The circuit of claim 18, wherein the resistive divider circuit includes:

multiple series connected resistors including a first resistor and a second resistor connected by a circuit node, and the multiple series connected resistors are connected in parallel to the battery; and a switching circuit coupled to the circuit node; and wherein the microcontroller is configured to change the configuration of the resistive divider circuit by activating the switching circuit to connect the circuit node to circuit ground.

22. The circuit of claim 18, wherein the microcontroller is configured to:

calculate a difference of sampled values of at least one of the first or second chassis voltages and determine a ratio of consecutive differences of the sampled values of the at least one of the first or second chassis voltages; and determine a decay value using the determined ratio and calculate the settled value of the at least one of the first or second chassis voltages using the determined decay value.

\* \* \* \* \*

UNITED STATES PATENT AND TRADEMARK OFFICE
CERTIFICATE OF CORRECTION

| | | |
|---|---|---|
| PATENT NO. | : 11,833,910 B2 | Page 1 of 1 |
| APPLICATION NO. | : 17/653585 | |
| DATED | : December 5, 2023 | |
| INVENTOR(S) | : Bitenc | |

It is certified that error appears in the above-identified patent and that said Letters Patent is hereby corrected as shown below:

On the Title Page

Item (12) Should read: Bitenc

In item (72), in "Inventor", in Column 1, Line 1, delete "Bitene," and insert --Bitenc,-- therefor Signed and Sealed this
Fifteenth Day of April, 2025

Coke Morgan Stewart
*Acting Director of the United States Patent and Trademark Office*